April 17, 1962 R. R. JOHNSON 3,030,581

ELECTRONIC COUNTER

Original Filed Aug. 11, 1953 2 Sheets-Sheet 1

Robert R. Johnson,
*INVENTOR.*
*BY.*
Edward J. Da Rin
*ATTORNEY.*

April 17, 1962 R. R. JOHNSON 3,030,581

ELECTRONIC COUNTER

Original Filed Aug. 11, 1953 2 Sheets-Sheet 2

$C_0 = \bar{A} \cdot \bar{B} \cdot \bar{C} \cdot \bar{D} \cdot \bar{E} \cdot \bar{F}$ Robert R. Johnson,
*INVENTOR.*

*BY.*

Edward J. Da Rin

*ATTORNEY.*

United States Patent Office 3,030,581

Patented Apr. 17, 1962

3,030,581

ELECTRONIC COUNTER

Robert R. Johnson, Palo Alto, Calif., assignor to Hughes Aircraft Company, Culver City, Calif., a corporation of Delaware Continuation of abandoned application Ser. No. 373,558, Aug. 11, 1953. This application July 1, 1958, Ser. No. 745,881

2 Claims. (Cl. 328—43)

This invention relates to electronic counters.

This application is a continuation of the earlier filed application of Robert R. Johnson, entitled "Shifting Register Counters," filed on August 11, 1953, and bearing Serial No. 373,558, now abandoned.

It is a general object of this invention to provide a novel, inexpensive and reliable high speed electronic counter requiring a minimum of gating elements and comprising a novel combination of a shifting register or delay line and a counting stage.

It is another object of this invention to provide an improved and simplified shifting counter of the character referred to in the previous object and adaptable for counting in any desired mode in a cyclic fashion without resorting to a resetting operation.

It is a further object of this invention to provide a novel and improved electronic pulse counter comprising shifting and counting stages arranged in a recirculating loop for controlling the pulse response sequence of one another.

It is yet another object of this invention to provide an improved electronic shifting counter capable of being sensed for rendering a control indication at any predetermined count within the capacity of the counter.

Other objects of the invention will be pointed out in the following description and claims and illustrated in the accompanying drawings, which disclose, by way of example, the principle of the invention and the best mode, which has been contemplated of applying that principle. Other embodiments of the invention employing the same or equivalent principle may be used and structural changes made as desired by those skilled in the art without departing from the present invention and within the spirit of the appended claims.

Figure 2:
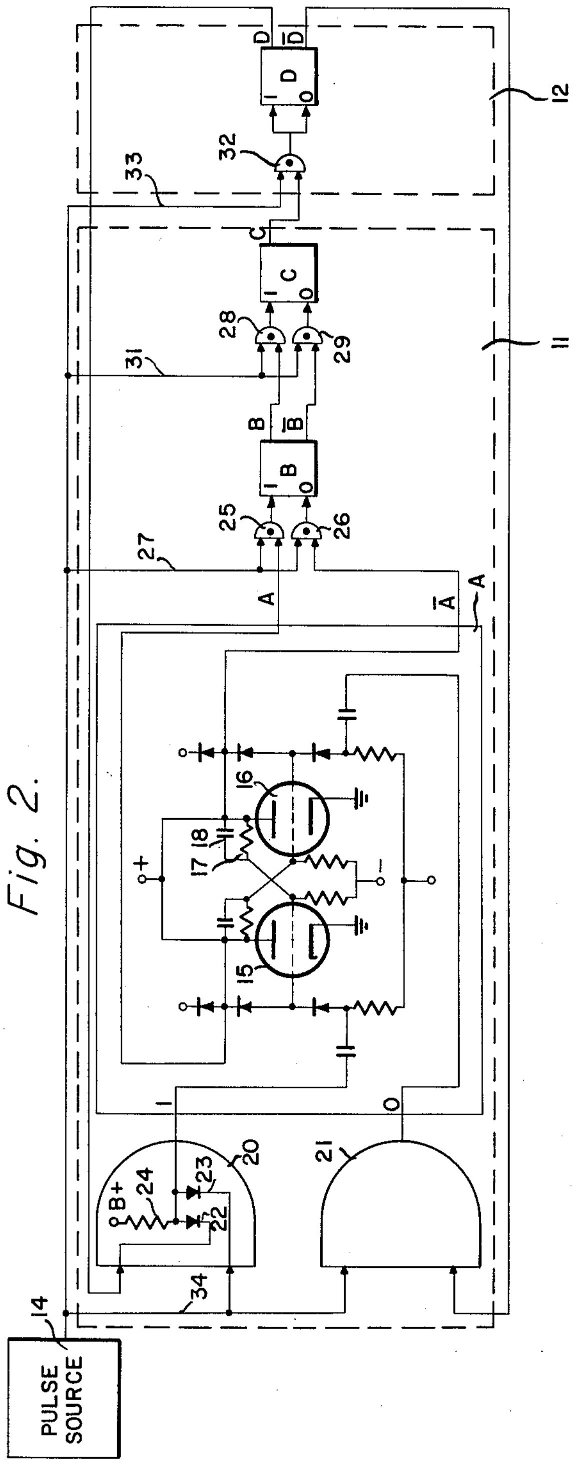
FIG. 2 is a partial block and diagrammatic representation of a novel counter constructed according to the invention.
Figure 1:
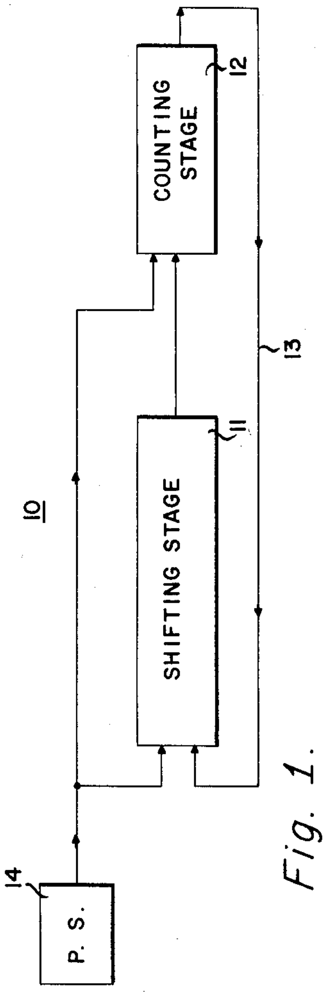
FIG. 1 is a block diagram of the novel electronic counter embodying the invention.

Briefly, the invention provides an electronic pulse counter comprising a cascaded arrangement of a shifting stage cooperating with a counting stage and connected in a recirculating loop. The shifting and counting stages each employ switching circuits arranged to simultaneously receive the pulses to be counted. The pulses to be counted are applied to "and" circuits arranged between each of the switching circuits for controlling same and including an "and" circuit connected between the serially connected shifting and counting stages. The latter "and" circuit renders the counting stage responsive to the pulses to be counted only when the final switching circuit of the shifting stage is in a preselected condition. The output condition of the counting stage is in turn arranged to simultaneously control the condition of the first switching circuit of the shifting stage to thereby determine the path of the pulses to be counted through the shifting stage. This latter control is effected by means including a recirculating loop interconnecting the output of the counting stage with the input to the shifting stage.

Referring to the drawings, the novel electronic counter 10 is shown as defined by a shifting stage 11 cascaded or serially arranged with a counting stage 12 interconnected by means of a lead wire 13 into a recirculating loop. A source of pulses 14 providing the pulses to be counted is shown coupled in parallel with the shifting stage 11 and the counting stage 12 to simultaneously receive the pulses therefrom.

The shifting stage 11 and the counting stage 12 each comprise switching circuits such as the switching circuit A, shown in FIG. 2 as a conventional bistable or flip-flop circuit. A typical circuit of this type comprises two triodes such as the triodes 15 and 16 connected together so that one is always conductive and the other non-conductive to thereby define the two stable states. The two tubes 15 and 16 are arranged in the usual fashion with cross coupling networks interconnecting the plate and grid circuits of the tubes 15 and 16. These networks comprise the parallel arrangement of a resistor and capacitor such as the resistor 17 and capacitor 18 illustrated. The switching circuit A, as will be seen from the examination of FIG. 2, in all other respects is symmetrical so that either tube 15 or 16 may be conducting. This type of bistable circuit has two static complementary output signals which are identified as the signals A and $\overline{A}$, one signal being derived from the plate of each tube. The signal A is derived from the plate of tube 15 while the signal $\overline{A}$ is derived from the plate of the tube 16. The input signals to the bistable circuit A are controllably delivered to the grid of either the tube 15 or the tube 16 by means of the corresponding input leads identified as the "one" input or the "zero" input. The "one" input is connected to the grid for the tube 15 while the "zero" input is coupled to the grid for the tube 16.

Each of the input circuits "one" and "zero" for the bistable circuit A are controlled by an individual two input "and" circuit or gate, respectively identified as the "and" circuits 20 and 21. The "and" circuit 20 may be any conventional "and" circuit known in the art and in this instance is schematically represented by a pair of similarly poled diodes 22 and 23 and which diodes are shown with their cathodes adapted to be connected to a source of a positive potential by means of a dropping resistor 24. The anodes of the diodes 22 and 23 are connected to provide the two input leads for the "and" circuit 20. The "and" circuit 20 operates in the conventional fashion, namely, an output signal will be delivered to the "one" input of switching circuit A when a signal is simultaneously present at the cathodes of both diodes 22 and 23. The "and" circuit 21 and the remaining "and" circuits employed in the counter 10 are similarly arranged and are symbolically represented in the same fashion as the "and" circuit 21. Also, the remaining switching circuits, identified as the switching circuits B and C for the switching stage 11, are shown in block form with the "one" and "zero" inputs and the complementary outputs such as the outputs B and $\overline{B}$ for the circuit B are shown in block form. The switching circuits B and C are both similarly arranged with an "and" circuit connected to control each of the "one" and "zero" inputs for these circuits. The "and" circuit 25 controls the "one" input for circuit B while the "and" circuit 26 controls the "zero" input for this circuit. Both the gates 25 and 26 are arranged to simultaneously receive a pulse from the pulse source 14 by means of a lead wire 27. The remaining input for the two-input circuit 25 is provided by the A output of the switching circuit A while the remaining input for circuit 26 is derived from the $\overline{A}$ output of circuit A.

In this same fashion, the B output of the switching circuit B is directly connected to the "and" circuit 28 for the "one" input of switching circuit C while the $\overline{B}$ output is directly connected to the "and" circuit 29 controlling the "zero" input of the C circuit. Each of the "and" circuits 28 and 29 are also arranged to receive simultaneously a pulse from the pulse source 14 by means of the lead wire 31.

The counting stage 12, in this instance, is shown as a single switching circuit D having "one" and "zero" inputs and D and $\overline{D}$ outputs. The counting circuit D has both its "one" and "zero" inputs controlled by a single two-input "and" circuit 32 and which "and" circuit is responsive to the simultaneous presence of a signal from the C output of circuit C and a pulse to be counted from the source 14 coupled thereto by means of the lead wire 33. The "and" circuit 32 controls the counting circuit D upon a signal being delivered thereto to change the state of the circuit to its opposite stable state; that is, if the output D is high and $\overline{D}$ is low and a signal is delivered from the circuit 32, the counting circuit D will be set with the $\overline{D}$ output high and the D output low.

The pulse source 14 is also coupled to one of the inputs for each of the input "and" circuits 20 and 21 of the shifting stage 11 by means of a lead wire 34. The pulses in this fashion are delivered simultaneously to each of the switching circuits comprising the shifting stage 11 and the counting stage 12. The remaining inputs for the "and" circuits 20 and 21 are respectively connected with the D and $\overline{D}$ outputs of the switching circuit D from counting stage 12. In this fashion, the shifting stage 11 and the counting stage 12 are connected in a recirculating or regenerative loop so that the output condition of the switching circuit D is registered or stored in the circuit A upon the coincidental arrival of a pulse from the source 14 at either of the circuits 20 or 21.

The simultaneous switching of the switching circuits A and D in response to a pulse to be counted obviates the time delay to propagate a "carry" from the circuit D to the circuit A. This simultaneous switching feature as applied to counters is described and claimed more fully in a copending application of Eldred C. Nelson, entitled "High Speed Flip-Flop Counter," filed on September 10, 1951, Serial No. 245,860, and assigned to the same assignee as this application.

It will now be appreciated from the above description that the switching circuits A–C are arranged in a parallel shift register configuration. The input circuit of this shift register is controlled by the output condition of the associated counting stage to thereby determine the path of a pulse to be counted through the shift register. It is also seen that only the "one" input signals registered in the C switching circuit are registered in the counting stage.

The operation of this novel counter 10 will now be explained in connection with FIG. 2 and Chart I.

*Chart I*

| Pulses to be Counted | Switching Circuits | | | |
|---|---|---|---|---|
| | A | B | C | D |
| 0 | 1 | 0 | 0 | 0 |
| 1 | 0 | 1 | 0 | 0 |
| 2 | 0 | 0 | 1 | 0 |
| 3 | 0 | 0 | 0 | 1 |
| 4 | 1 | 0 | 0 | 1 |
| 5 | 1 | 1 | 0 | 1 |
| 6 | 1 | 1 | 1 | 1 |
| 7 | 1 | 1 | 1 | 0 |
| 8 | 0 | 1 | 1 | 1 |
| 9 | 1 | 0 | 1 | 0 |
| 10 | 0 | 1 | 0 | 1 |
| 11 | 1 | 0 | 1 | 1 |
| 12 | 1 | 1 | 0 | 0 |
| 13 | 0 | 1 | 1 | 0 |
| 14 | 0 | 0 | 1 | 1 |
| 15 | 1 | 0 | 0 | 0 |

As it will be noted from the above chart, the counter 10 is a scale of 15 counter and is initially arranged with the switching circuit A in the "one" stage while the remaining switching circuits B, C and D are arranged in the "zero" stage. The "one" and "zero" notation in Chart I is intended to indicate that a switching circuit in the "one" state has its corresponding output "high" and the complementary output "low," for example, the switching circuit A initially has its A output "high" and the complementary $\overline{A}$ output "low." Since the switching circuits A, B and C are arranged as a shift register, the first two pulses to be counted will merely shift the initial "one" state of switching circuit A to switching circuit C. Also, since the counting stage D is in the "zero" state, the first two pulses are shifted through the shifting stage 11 as "zeros." The third pulse to be counted will be effective to switch the C circuit to the "zero" state and in turn the counting circuit D will register a "one."

The "one" stored in the counting stage D is indicated by a "high" output signal at the D output so that upon the arrival of the fourth pulse to be counted, a "one" will be registered in the A circuit, as a result of the storage condition of the D circuit being recirculated to the A circuit, rather than a "zero" as in the previous instances. A "one" will continue to be registered in the switching circuit A in response to the pulses to be counted as long as the D circuit remains in this state as indicated in the chart in response to the fifth and sixth pulses. The pulses previously stored in the A circuit are in turn shifted to the B and C flip-flops so that after the arrival of the sixth pulses, all circuits are in the "one" state. The arrival of the seventh pulse changes the state of the D circuit back to the "zero" state while the "ones" registered in the other circuits are shifted one position to the right. In this same fashion, the counter 10 will respond to the pulses to be counted and follow the sequence indicated in Chart I until the arrival of the fifteenth pulse which sets the counter in the 1000 configuration and which configuration corresponds to the initial or "zero" state of the counter. The arrival of the sixteenth pulse will then cause the counter 10 to go through another sequence similar to the sequence shown in Chart I. It should be noted that this counter follows the same sequence automatically and resets itself without any special provisions therefor.

Figure 3:
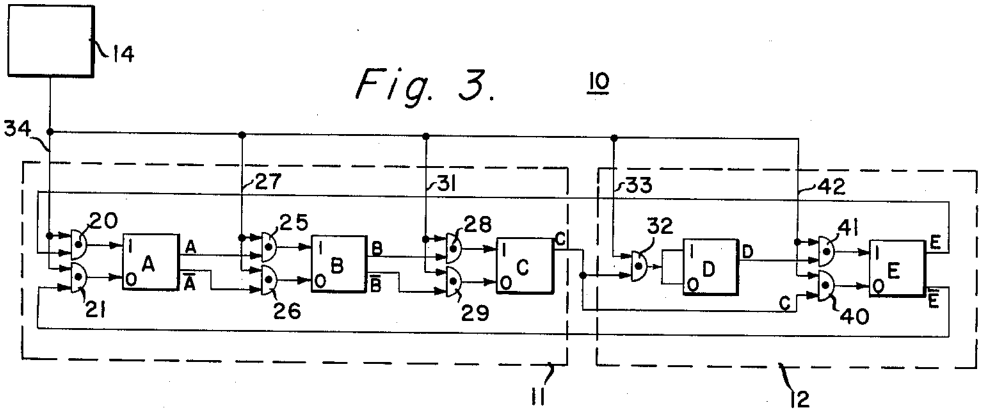
FIGS. 3 and 4 are block diagrams of other embodiments of the invention.

Now referring to FIG. 3, a scale of 31 counter of generally the same configuration as the counter of FIG. 2, will be described. The chief characteristic of this scale of 31 counter is the utilization of a pair of switching circuits shown as the switching circuits D and E for the counting stage 12 rather than a single switching circuit as shown in the previous embodiment. The switching circuits A–C comprise the shifting stage 11 as in the previous embodiment and are controlled in the same fashion.

The output signal derived from the shifting stage 11 is utilized to control both the switching circuits D and E in this embodiment. Alternatively, the C output is connected to the "and" circuit 32 controlling both the input leads for the D circuit and is also coupled to input lead of an "and" circuit 40 connected to control the "zero" input lead for the switching circuit E. The "one" input circuit for switching circuit E is provided with a separate "and" circuit 41 and which circuit is connected to the D output of switching circuit D along with a connection to the source 14, by means of the lead wire 42. The pulses to be counted from the pulse source 14 are also applied to the "and" circuit 40 by means of the lead wire 42. It will be noted that the $\overline{D}$ output circuit is not utilized in this embodiment and that the E and $\overline{E}$ ouputs are coupled back to control the "one" and "zero" inputs, respectively, for switching circuit A.

The operation of this scale of 31 counter is generally the same shifting and counting action as described in conjunction with FIG. 2 as will be apparent from an examination of Chart II below.

*Chart II*

| Pulses To Be Counted | Switching Circuits | | | | |
|---|---|---|---|---|---|
| | A | B | C | D | E |
| 0 | 1 | 0 | 0 | 0 | 0 |
| 1 | 0 | 1 | 0 | 0 | 0 |
| 2 | 0 | 0 | 1 | 0 | 0 |
| 3 | 0 | 0 | 0 | 1 | 0 |
| 4 | 0 | 0 | 0 | 1 | 1 |
| 5 | 1 | 0 | 0 | 1 | 1 |
| 6 | 1 | 1 | 0 | 1 | 1 |
| 7 | 1 | 1 | 1 | 1 | 1 |
| 8 | 1 | 1 | 1 | 0 | 0 |
| 9 | 0 | 1 | 1 | 1 | 0 |
| 10 | 0 | 0 | 1 | 0 | 1 |
| 11 | 1 | 0 | 0 | 1 | 0 |
| 12 | 0 | 1 | 0 | 1 | 1 |
| 13 | 1 | 0 | 1 | 1 | 1 |
| 14 | 1 | 1 | 0 | 0 | 0 |
| 15 | 0 | 1 | 1 | 0 | 0 |
| 16 | 0 | 0 | 1 | 1 | 0 |
| 17 | 0 | 0 | 0 | 0 | 1 |
| 18 | 1 | 0 | 0 | 0 | 1 |
| 19 | 1 | 1 | 0 | 0 | 1 |
| 20 | 1 | 1 | 1 | 0 | 1 |
| 21 | 1 | 1 | 1 | 1 | 0 |
| 22 | 0 | 1 | 1 | 0 | 1 |
| 23 | 1 | 0 | 1 | 1 | 0 |
| 24 | 0 | 1 | 0 | 0 | 1 |
| 25 | 1 | 0 | 1 | 0 | 1 |
| 26 | 1 | 1 | 0 | 1 | 0 |
| 27 | 0 | 1 | 1 | 1 | 1 |
| 28 | 1 | 0 | 1 | 0 | 0 |
| 29 | 0 | 1 | 0 | 1 | 0 |
| 30 | 0 | 0 | 1 | 1 | 1 |
| 31 | 1 | 0 | 0 | 0 | 0 |

Figure 4:
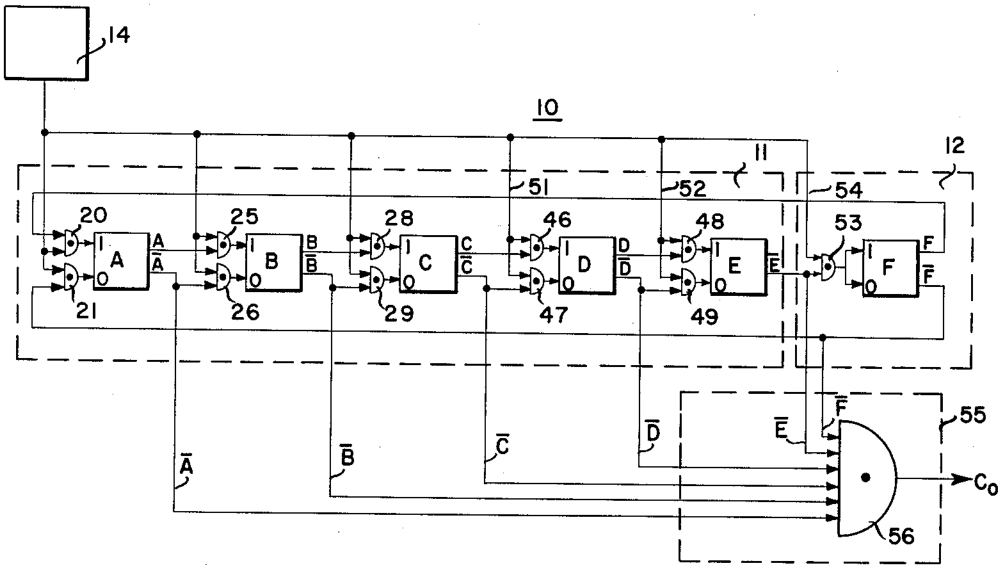

Now referring to FIG. 4, a scale of 63 counter utilizing five switching circuits in the shifting stage 11 and a single switching circuit for the counting stage 12 will be explained. The general principle of operation of this counter is similar to the operating principles of the previous embodiments, however, this embodiment is arranged with its initial or "zero" condition so that all the switching circuits are in the "zero" state. In addition, this counting circuit shows means for sensing or indicating when the counter is registering a preselected count as will be explained immediately hereinafter.

The shifting stage 11 is arranged as in the previous embodiment and the additional shifting circuits D and E are provided with individual "and" circuits 46, 47, 48 and 49 for controlling their "one" and "zero" inputs in the same manner as the remaining switching circuits of the shifting stage are controlled. The "and" circuit 46 controls the "one" input while the "and" circuit 47 controls the "zero" input for switching circuit D while the circuits 48 and 49 respectively control the "one" and "zero" inputs for switching circuit E. The C output is connected to the remaining input for the "and" circuit 46 while the $\bar{C}$ output is connected to the remaining input of "and" circuit 47 and the D and $\bar{D}$ outputs are similarly arranged with "and" circuits 48 and 49. In addition, these two-input "and" circuits receive a pulse to be counted from the source 14 by means of the lead wire 51 connected to the circuits 46 and 47 and the lead wire 52 connected to the circuits 48 and 49.

The output of shifting stage 11 is provided by the signal derived from the $\bar{E}$ output of switching circuit E and which signal is coupled into "and" circuit 53 controlling both the "one" and "zero" inputs of counting circuit F. The pulses to be counted are also applied to the "and" circuit 53 by means of a lead wire 54 coupled to the source 14. The control afforded by the single "and" circuit 53 causes the circuit F to be complemented with each output signal received from circuit 53. The F and $\bar{F}$ outputs of the counting circuit F are fed back to the "one" and "zero" outputs of shifting circuit A through their respective "and" circuits 20 and 21.

An important feature of this embodiment is the means for sensing a predetermined configuration or count of the counter and which means comprises, in this instance, a comparison circuit shown in dotted outline and identified by the reference character 55. The comparison circuit 55 is arranged to sense when each of the switching circuits A–F are in a "zero" state corresponding to the time interval when a complete counting cycle has occurred. This indication is provided by means of a six-input "and" circuit 56. The six inputs to the "and" circuit 56 comprise the complementary outputs of each of the switching circuits, namely, the $\bar{A}$, $\bar{B}$, $\bar{C}$, $\bar{D}$, $\bar{E}$ and $\bar{F}$ output circuits are connected directly as inputs to the "and" circuit 56 as shown. Accordingly, when each of these $\bar{A}$–$\bar{F}$ circuits are in the "zero" state, the corresponding complementary outputs will be "high" and an output signal will be provided at the output circuit of the "and" circuit 56 and which output circuit is identified as $C_0$.

The operation of this novel scale of 63 counter will now be explained in connection with FIG. 4 and Chart III.

*Chart III*

| Pulses To Be Counted | Switching Circuits | | | | | |
|---|---|---|---|---|---|---|
| | A | B | C | D | E | F |
| 0 | 0 | 0 | 0 | 0 | 0 | 0 |
| 1 | 0 | 0 | 0 | 0 | 0 | 1 |
| 2 | 1 | 0 | 0 | 0 | 0 | 0 |
| 3 | 0 | 1 | 0 | 0 | 0 | 1 |
| 4 | 1 | 0 | 1 | 0 | 0 | 0 |
| 5 | 0 | 1 | 0 | 1 | 0 | 1 |
| 6 | 1 | 0 | 1 | 0 | 1 | 0 |
| 7 | 0 | 1 | 0 | 1 | 0 | 0 |
| 8 | 0 | 0 | 1 | 0 | 1 | 1 |
| 9 | 1 | 0 | 0 | 1 | 0 | 1 |
| 10 | 1 | 1 | 0 | 0 | 1 | 0 |
| 11 | 0 | 1 | 1 | 0 | 0 | 0 |
| 12 | 0 | 0 | 1 | 1 | 0 | 1 |
| 13 | 1 | 0 | 0 | 1 | 1 | 0 |
| 14 | 0 | 1 | 0 | 0 | 1 | 0 |
| 15 | 0 | 0 | 1 | 0 | 0 | 0 |
| 16 | 0 | 0 | 0 | 1 | 0 | 1 |
| 17 | 1 | 0 | 0 | 0 | 1 | 0 |
| 18 | 0 | 1 | 0 | 0 | 0 | 0 |
| 19 | 0 | 0 | 1 | 0 | 0 | 1 |
| 20 | 1 | 0 | 0 | 1 | 0 | 0 |
| 21 | 0 | 1 | 0 | 0 | 1 | 1 |
| 22 | 1 | 0 | 1 | 0 | 0 | 1 |
| 23 | 1 | 1 | 0 | 1 | 0 | 0 |
| 24 | 0 | 1 | 1 | 0 | 1 | 1 |
| 25 | 1 | 0 | 1 | 1 | 0 | 1 |
| 26 | 1 | 1 | 0 | 1 | 1 | 0 |
| 27 | 0 | 1 | 1 | 0 | 1 | 0 |
| 28 | 0 | 0 | 1 | 1 | 0 | 0 |
| 29 | 0 | 0 | 0 | 1 | 1 | 1 |
| 30 | 1 | 0 | 0 | 0 | 1 | 1 |
| 31 | 1 | 1 | 0 | 0 | 0 | 1 |
| 32 | 1 | 1 | 1 | 0 | 0 | 0 |
| 33 | 0 | 1 | 1 | 1 | 0 | 1 |
| 34 | 1 | 0 | 1 | 1 | 1 | 0 |
| 35 | 0 | 1 | 0 | 1 | 1 | 0 |
| 36 | 0 | 0 | 1 | 0 | 1 | 0 |
| 37 | 0 | 0 | 0 | 1 | 0 | 0 |
| 38 | 0 | 0 | 0 | 0 | 1 | 1 |
| 39 | 1 | 0 | 0 | 0 | 0 | 1 |
| 40 | 1 | 1 | 0 | 0 | 0 | 0 |
| 41 | 0 | 1 | 1 | 0 | 0 | 1 |
| 42 | 1 | 0 | 1 | 1 | 0 | 0 |
| 43 | 0 | 1 | 0 | 1 | 1 | 1 |
| 44 | 1 | 0 | 1 | 0 | 1 | 1 |
| 45 | 1 | 1 | 0 | 1 | 0 | 1 |
| 46 | 1 | 1 | 1 | 0 | 1 | 0 |
| 47 | 0 | 1 | 1 | 1 | 0 | 0 |
| 48 | 0 | 0 | 1 | 1 | 1 | 1 |
| 49 | 1 | 0 | 0 | 1 | 1 | 1 |
| 50 | 1 | 1 | 0 | 0 | 1 | 1 |
| 51 | 1 | 1 | 1 | 0 | 0 | 1 |
| 52 | 1 | 1 | 1 | 1 | 0 | 0 |
| 53 | 0 | 1 | 1 | 1 | 1 | 1 |
| 54 | 1 | 0 | 1 | 1 | 1 | 1 |
| 55 | 1 | 1 | 0 | 1 | 1 | 1 |
| 56 | 1 | 1 | 1 | 0 | 1 | 1 |
| 57 | 1 | 1 | 1 | 1 | 0 | 1 |
| 58 | 1 | 1 | 1 | 1 | 1 | 0 |
| 59 | 0 | 1 | 1 | 1 | 1 | 0 |
| 60 | 0 | 0 | 1 | 1 | 1 | 0 |
| 61 | 0 | 0 | 0 | 1 | 1 | 0 |
| 62 | 0 | 0 | 0 | 0 | 1 | 0 |
| 63 | 0 | 0 | 0 | 0 | 0 | 0 |

As indicated in Chart III hereinabove, the initial condition of the switching circuits A–F comprising the novel scale of 63 counter is set in the "zero" state. As a result of this initial setting, the first pulse to be counted, derived from the source 14 and applied to the switching circuit A, will be stored in circuit A as a "zero" since the $\bar{F}$ output is "high." Also, since the $\overline{E}$ output is "high," the first pulse arriving at "and" circuit 53 will set switching circuit F to the "one" state, and the corresponding F output will be "high." As in the previous embodiments, all of the switching circuits switch simultaneously and the storage condition of the counting stage 12 is recirculated back to control the input to the shifting stage 11 so that the "one" state of shifting circuit F is registered in circuit A upon the arrival of the second pulse to be counted. The second pulse to be counted also shifts the storage condition of circuits A–E one position to the right in response to the pulses to be counted and at this time leaves circuits B–E in the "zero" state. The "and" circuit 53 is arranged to complement the switching circuit F when its input conditions are satisfied and since the circuit E is in the "zero" state, the counting stage F will be switched to the "zero" state in response to the second pulse to be counted.

An examination of Chart III shows that the storage condition of switching circuit F is regenerated at the circuit A in this same fashion and the condition of circuit F will be complemented or changed each time a pulse to be counted arrives at the "and" circuit 53 and finds switching circuit E in the "zero" state. Accordingly, the counts from the third pulse to the 63rd will cause the counter to assume the configurations noted in Chart III and the 63rd pulse will return each of the circuits A–F to the "zero" state completing a counting cycle. At this time, each of the outputs $\overline{A}$–$\overline{F}$ are in the "high" condition and an output signal will result at the $C_0$ output of comparison circuit 55.

It should be noted that an indication of the count configuration of any preselected count of the counter may be sensed in addition to the sensing of a complete counting cycle. That is, any count within the capacity of the counter may be indicated by an appropriate sensing circuit. For example, in the counter under consideration wherein the counter sequences through 63 separate counting steps and an output indication is desired when the 30th pulse has been counted, an output indication may be obtained by means of the comparison circuit 55. This output indication is provided by presetting the switching circuits A–F so that their initial condition is set to a count of 33 (63 minus 30) or 011101, as may be checked in Chart III hereinabove. Accordingly, after 30 pulses have been counted by the counter preset in this configuration, each of the switching circuits will be set in the "zero" state and an output indication will be provided at the output circuit $C_0$. In this same fashion, any other count may be sensed.

Other forms of comparison circuits other than the circuit 55 may be utilized with the counters of this invention. For example, a serial operating comparison circuit such as the circuit described and claimed in the copending application of R. R. Johnson, entitled "Electronic Magnitude Comparator," Serial No. 394,441, filed on November 25, 1953, and assigned to the same assignee as this application, may be utilized. The sensing circuit may also be arranged to be responsive to preselected signals from the counter rather than all signals and which preselected signals are characteristic of a single count.

It will also be recognized by those skilled in the art that the shifting stage 11 may be any well-known shift register, such as a magnetic core register, or any well-known delay line such as a sonic delay line or a magnetic drum circulating register. Furthermore, the counter principle may be employed to count time periods as well as pulses. A combination of these basic counters connected in series may be organized to define a counter of any desired capacity. For example, two single flip-flop counters may be operated simultaneously to provide a count capacity equal to the product of the different factors. Thus, a 63 counter and an 889 counter, having common factors of 7 ($7\times127=889$ and $7\times9=63$), can be operated simultaneously to provide a counter capacity of 8001 ($7\times9\times127$) and a 1533 counter and 3231 counter may be operated simultaneously to provide a counter capacity of 1,651,041 ($3\times3\times359\times7\times73$).

It will now be appreciated that the objects of this invention have been achieved and a novel and improved counter has been disclosed and which disclosure has advanced the state of the art.

What is claimed is:

1. An electrical counter circuit, comprising: an electrical signal-switching circuit including a plurality of bistable electrical devices each having a pair of input circuits and a pair of output circuits, respective gate circuits interconnecting the output circuits of one bistable device with the corresponding input circuits of a succeeding bistable device to serially interconnect said bistable devices; a second electrical signal switching circuit including at least one bistable electrical device having a pair of input circuits and a pair of output circuits; a gate circuit connecting one output circuit of the last of said serially connected bistable devices of said first mentioned electrical signal switching circuit with both input circuits of said bistable device of said second electrical signal switching circuit; respective gate circuits connecting the output circuits of said bistable device of said second electrical signal switching circuit with the corresponding input circuits of the first bistable device of said first mentioned electrical signal switching circuit; and an electrical signal circuit, producing electrical pulses to be counted, connected to each gate circuit.

2. An electrical counter circuit, comprising: an electrical signal switching circuit including a plurality of bistable electrical devices each having respective "1" and "0" representing input circuits and "1" and "0" representing output circuits, respective gate circuits connecting the "1" and "0" representing output circuits of one bistable electrical device, with the "1" and "0" representing input circuit, respectively, of a succeeding bistable electrical device; a second electrical signal switching circuit including at least one bistable electrical device having respective "1" and "0" representing input circuits and respective "1" and "0" representing output circuits; a gate circuit connecting the "1" representing output circuit of the last of said serially connected bistable devices of said first mentioned electrical signal switching circuit with both input circuits of said bistable electrical device of said second electrical signal switching circuit; respective gate circuits connecting the "1" and "0" representing output circuits of said bistable electrical device of said second electrical signal switching circuit to the "1" and "0" representing input circuits, respectively, of the first of said bistable electrical devices of said first mentioned electrical signal shifting circuit; and an electrical signal circuit, producing pulses to be counted, connected to each gate circuit.

References Cited in the file of this patent

UNITED STATES PATENTS

| | | |
|---|---|---|
| 2,542,644 | Edson | Feb. 20, 1951 |
| 2,615,127 | Edwards | Oct. 21, 1952 |
| 2,806,947 | MacKnight | Sept. 11, 1957 |
| 2,819,840 | Huntley et al. | Jan. 14, 1958 |
| 2,853,238 | Johnson | Sept. 23, 1958 |
| 2,951,230 | Cadden | Aug. 30, 1960 |